(12) United States Patent
Yun et al.

(10) Patent No.: US 11,215,664 B1
(45) Date of Patent: Jan. 4, 2022

(54) NON-INVASIVE ON-CHIP POWER MEASUREMENT TECHNIQUE

(71) Applicant: Apple Inc., Cupertino, CA (US)

(72) Inventors: Ke Yun, San Jose, CA (US); Weibiao Zhang, Saratoga, CA (US); Bruno W. Garlepp, Sunnyvale, CA (US); Gin S. Yee, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 1 day.

(21) Appl. No.: 16/906,715

(22) Filed: Jun. 19, 2020

(51) Int. Cl.
*G01R 31/28* (2006.01)
*G01R 31/30* (2006.01)

(52) U.S. Cl.
CPC ..... *G01R 31/3008* (2013.01); *G01R 31/2884* (2013.01)

(58) Field of Classification Search
CPC .............. G01R 19/257; G01R 31/2884; G01R 31/3004; G01R 31/3181; G01R 31/31813
See application file for complete search history.

(56) References Cited

U.S. PATENT DOCUMENTS

| | | | |
|---|---|---|---|
| 8,286,120 B2 | 10/2012 | Potkonjak | |
| 9,904,343 B2 | 2/2018 | Jeon | |
| 10,175,267 B2 | 1/2019 | Hu et al. | |
| 10,523,194 B2 | 12/2019 | Raszka et al. | |
| 2016/0065067 A1* | 3/2016 | Isham | G01R 19/0092 323/271 |
| 2019/0369151 A1* | 12/2019 | Meiser | G01R 31/2621 |

* cited by examiner

*Primary Examiner* — Tung X Nguyen
(74) *Attorney, Agent, or Firm* — Kowert, Hood, Munyon, Rankin & Goetzel, P.C.

(57) ABSTRACT

An apparatus includes an integrated circuit that includes an in-circuit power switch coupled to a power supply node, a functional circuit coupled between the in-circuit power switch and a ground node, a test circuit, and a test power switch coupled to the test circuit, wherein the test power switch is a replica of the in-circuit power switch. The test circuit is configured to determine characteristics of the test power switch, and to measure a voltage difference across the in-circuit power switch. The test circuit is also configured to use the characteristics of the test power switch and the voltage difference to determine a power consumption of the functional circuit.

20 Claims, 9 Drawing Sheets

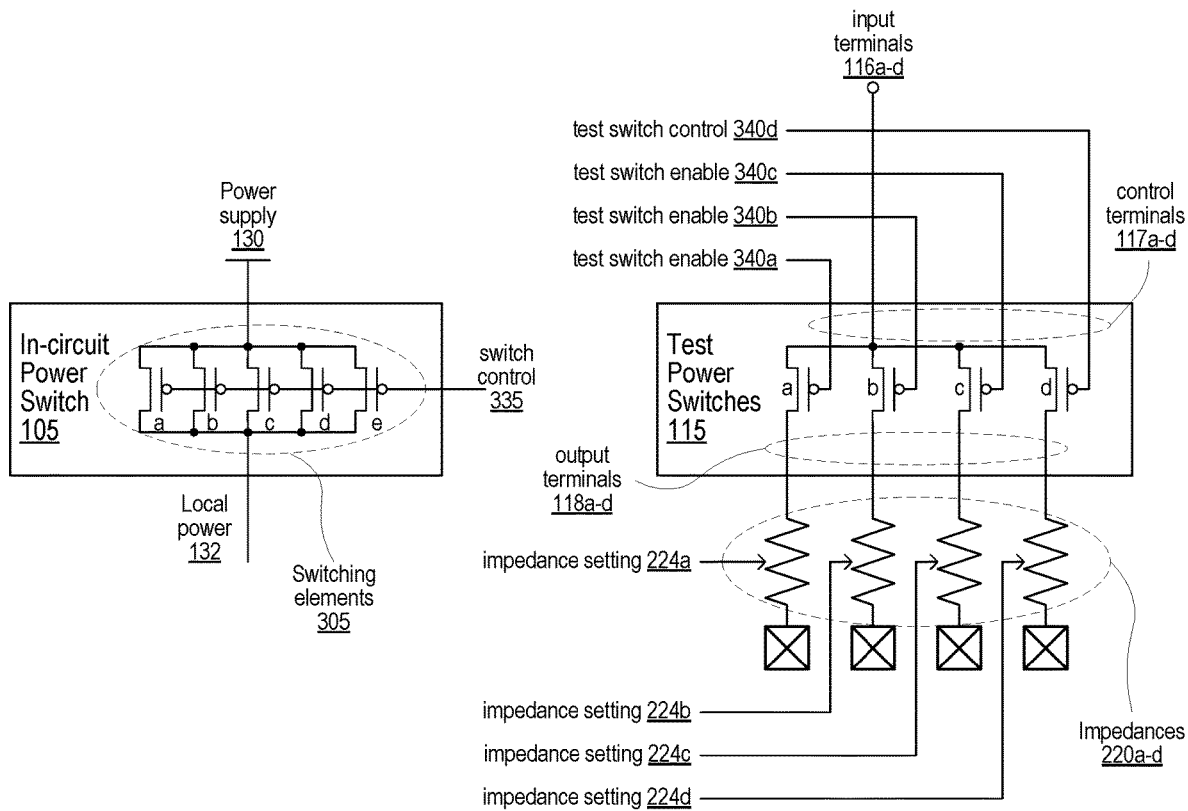
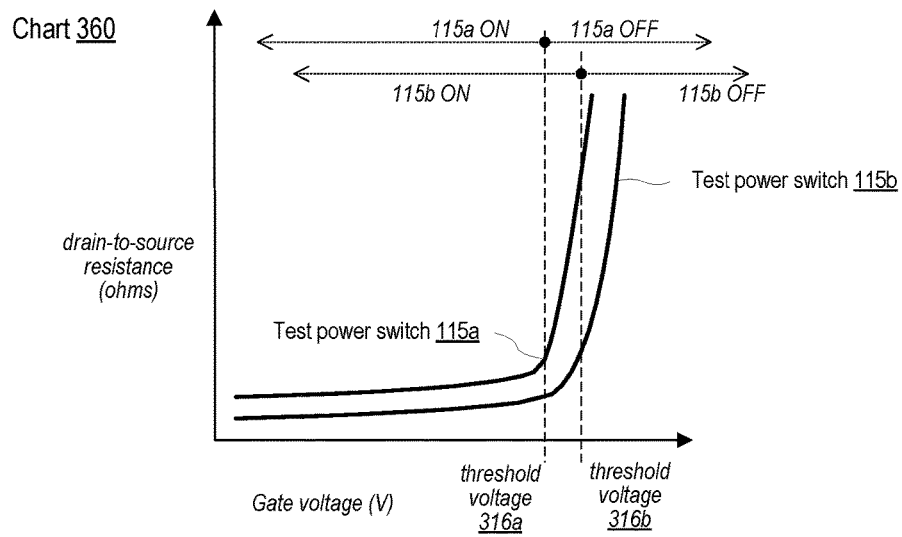
FIG. 3

*600*

```
         ┌─────────┐
         │  Start  │
         │   601   │
         └────┬────┘
              ▼
┌──────────────────────────────────────────────────┐
│ measuring, by a test circuit, characteristics of │
│ a particular test power switch included in an    │
│ integrated circuit, wherein the particular test  │
│ power switch is a replica of an in-circuit power │
│ switch included in the integrated circuit;.      │
│                      610                          │
└──────────────────┬───────────────────────────────┘
                   ▼
┌──────────────────────────────────────────────────┐
│ measuring voltage levels of one or more terminals │
│ of the in-circuit power switch.                   │
│                      620                          │
└──────────────────┬───────────────────────────────┘
                   ▼
┌──────────────────────────────────────────────────┐
│ determining, by the test circuit, a current      │
│ through the in-circuit power switch using the    │
│ characteristics of the particular test power     │
│ switch and the measured voltage levels.          │
│                      630                          │
└──────────────────┬───────────────────────────────┘
                   ▼
┌──────────────────────────────────────────────────┐
│ estimating, by the test circuit using the        │
│ determined current, a power consumption of a     │
│ functional circuit coupled to the in-circuit     │
│ power switch.                                     │
│                      640                          │
└──────────────────┬───────────────────────────────┘
                   ▼
              ┌─────────┐
              │   End   │
              │   690   │
              └─────────┘
```

*FIG. 6*

NON-INVASIVE ON-CHIP POWER MEASUREMENT TECHNIQUE

BACKGROUND

Technical Field

Embodiments described herein are related to the field of integrated circuit testing, and more particularly to circuits for measuring power.

Description of the Related Art

Manufacturing of integrated circuits (ICs), such as those implementing a system-on-a-chip (SoC), typically include testing manufactured units to identify defective ICs before shipping to a customer or inserting the ICs into products. In addition to functional tests and various parametric tests, testing of ICs may include measuring power consumption of circuits within the ICs. Abnormal levels of power consumption may provide a useful indicator of manufacturing defects or other issues with a given IC.

Measuring power of an IC typically utilizes some type of current measurement device (e.g., a current-sense resistor) to be included within the power path. Measuring a current passing through a circuit and a voltage level associated with the current allows a power consumption value to be determined.

SUMMARY OF THE EMBODIMENTS

Broadly speaking, apparatus, and methods are contemplated in which an example apparatus includes an integrated circuit that includes an in-circuit power switch coupled to a power supply node, a functional circuit coupled between the in-circuit power switch and a ground node, a test circuit, and a test power switch coupled to the test circuit, wherein the test power switch is a replica of the in-circuit power switch. The test circuit may be configured to determine characteristics of the test power switch, and to measure a voltage difference across the in-circuit power switch. The test circuit may also be configured to use the characteristics of the test power switch and the voltage difference to determine a power consumption of the functional circuit.

In a further example, to determine the characteristics of the test power switch, the test circuit may be further configured to close the test power switch, and to measure a voltage difference across the test power switch while a particular amount of current passes through the test power switch. In one example, to determine the power consumption of the functional circuit, the test circuit may be further configured to estimate a current flowing the in-circuit power switch using a determined on-resistance of the test power switch and the voltage difference across the in-circuit power switch.

In another example, the integrated circuit further includes a plurality of test power switches, including the test power switch. Ones of the plurality of test power switches have different characteristics from other test power switches. In an embodiment, to use the characteristics of the test power switch, the test circuit may be further configured to select a corresponding test power switch from the plurality of test power switches using a lookup table that maps in-circuit power switches to corresponding ones of the plurality of test power switches.

In one example, the in-circuit power switch includes a particular number of switching elements, wherein one switching element corresponds to the test power switch, and wherein the test circuit is further configured to adjust the characteristics of the test power switch using the particular number, and to determine the power consumption of the functional circuit using the adjusted characteristics. In a further example, the test circuit includes an analog-to-digital converter (ADC) and wherein to measure the voltage difference across the in-circuit power switch, the test circuit is further configured to use the ADC to generate respective values indicative of voltage levels of an input terminal and an output terminal of the in-circuit power switch, and to use the generated values to determine the voltage difference.

BRIEF DESCRIPTION OF THE DRAWINGS

The following detailed description makes reference to the accompanying drawings, which are now briefly described.

FIG. 3 depicts diagrams of an in-circuit power switch, a set of test power switches, and a chart showing an example characteristic of power switches.

FIG. 6 shows a flow diagram of an embodiment of a method for determining power consumption of a functional circuit.

Figure 1:
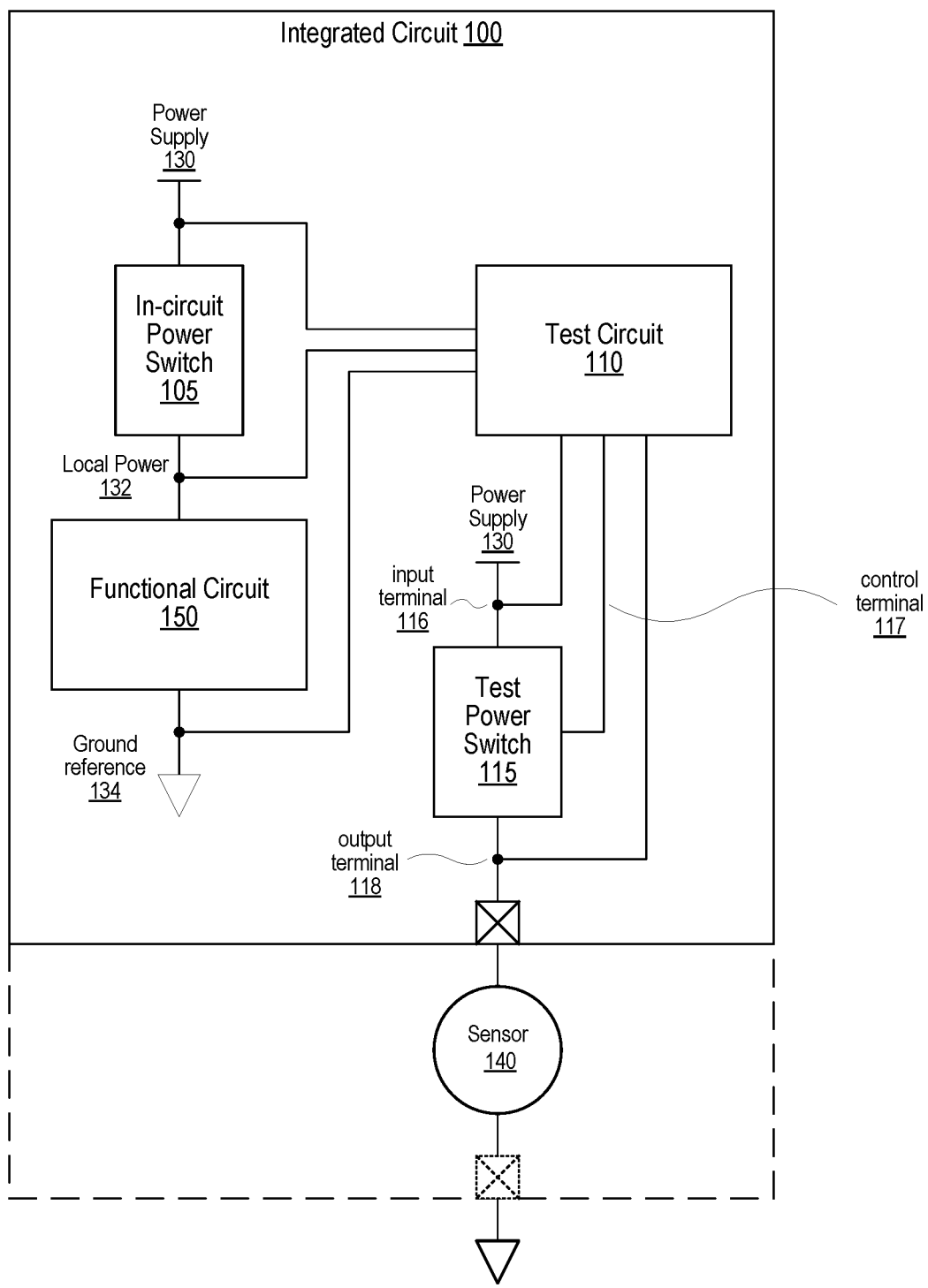
FIG. 1 illustrates a block diagram of an embodiment of an integrated circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Power measurement techniques have traditionally included a current sensing device (e.g., a current-sense resistor) placed in series between a power supply node and a circuit for which power is being measured. Inclusion of such a device is invasive, as additional impedance introduced into the power path by the device may alter the characteristics of the circuit for which power is being measured, thereby resulting is a reduction in accuracy of the power measurement. Accordingly, the present inventors have identified a desire for a non-invasive power measurement technique for integrated circuits (ICs).

A non-invasive power measurement scheme, disclosed herein, is designed to determine both active and power-down (e.g., leakage) power measurements in an IC. In contrast to other approaches, the disclosed techniques reduce the circuitry overhead for functional circuits to be measured, and advantageously do not introduce a sensing device into the power paths of the circuits. Instead, to determine power consumption of a functional circuit, access is provided to various power nodes associated with the functional circuit. These power nodes include non-switched power supply, a local power supply, and ground reference. Connections from these power nodes are routed to a test circuit that is capable of taking voltage level measurements of the power nodes. The test circuit may be placed at any convenient location within the IC.

Embodiments of a non-invasive power measurement technique are disclosed below. One such power measurement technique is disclosed relative to a power switch included on an integrated circuit. A replica of the power switch that is included on an integrated circuit (IC) is evaluated, and a voltage drop across the (original) power switch is measured. A current through the power switch is determined using the evaluation of the replica power switch, and a power consumption of the functional circuit is determined using the determined current. Using such a technique may enable a power consumption measurement of the functional circuit to be performed without the use of an invasive sensing element.

Furthermore, a similar power measurement technique may be employed to determine a leakage current of the functional circuit. Using this similar technique, leakage characteristics of the replica power switch are determined for various voltage biases applied to the replica switch. A voltage drop across the power switch coupled to the functional circuit is determined. A leakage current of the functional circuit is determined using the leakage characteristics of the replica power switch and the voltage drop across the power switch.

A block diagram for an embodiment of an integrated circuit is illustrated in FIG. 1. Integrated circuit 100 may be tested as part of a production manufacturing process and/or as part of an evaluation. For example, integrated circuit 100 may be evaluated as part of a new product development process that determines whether a new product performs to expectations. In some embodiments, integrated circuit 100 may be included in a computing device and tested after the computing device is partially or completely assembled. As illustrated, integrated circuit 100 includes functional circuit 150 that receives power via in-circuit power switch 105. Functional circuit 150 is intended to refer to any type of "non-test" circuit within IC 100. Integrated circuit 100 further includes test circuit 110 coupled to test power switch 115, as well as to power nodes power supply 130, local power node 132, and ground reference 134. In some embodiments, sensor 140 is included in integrated circuit 100, while in other embodiments, sensor 140 is coupled to integrated circuit 100 externally.

As shown, integrated circuit 100 may correspond to any suitable type of circuit, such as a microprocessor, a system-on-chip (SoC), a cellular radio, a random-access memory device (RAM), a non-volatile storage device (e.g., flash memory), and the like. Functional circuit 150 may be a main circuit block within integrated circuit 100 (e.g., a transceiver circuit in a cellular radio IC), or may be one of a plurality of circuit blocks included in integrated circuit 100 (e.g., a clock generation circuit in an SoC with a processor complex, input/output circuits, power management circuits, etc.). Power to functional circuit 150 is provided through in-circuit power switch 105. In some embodiments, functional circuit 150 may include more than one circuit block, thereby representing some or all circuit blocks that receive power via in-circuit power switch 105. In-circuit power switch 105 is coupled to a first power node, power supply 130, that provides power, via in-circuit power switch 105, to one or more circuits including functional circuit 150, and to a second power node, local power node 132, that receives power from power supply 130 when in-circuit power switch 105 is in a closed state. In an open state, in-circuit power switch 105 restricts a flow of current from power supply 130 to functional circuit 150, thereby placing functional circuit 150 into a power-down state. In the closed state, in-circuit power switch 105 allows current to flow from power supply 130 to local power node 132, thereby providing power to functional circuit 150 and placing functional circuit 150 into an active state. During operation of integrated circuit 100, in-circuit power switch 105 may be used to enable or power down functional circuit 150 as needed.

As part of testing integrated circuit 100, the power consumption of functional circuit 150 may be measured. A common method for measuring power consumption includes determining a current flowing into a circuit and a voltage drop across the circuit. Measuring a voltage level of power supply 130 or local power node 132 referenced to ground reference 134 can be performed by test circuit 110 with little to no effect on the voltage levels. Measuring a current flowing through in-circuit power switch 105 into functional circuit 150, however, would typically involve adding a power sense resistor, or other device, somewhere in the path from power supply 130 to ground reference 134.

This approach leads to inaccuracies. As current used by functional circuit 150 increases, a voltage difference across the sense resistor increases. This increased voltage difference, however, induces a corresponding decrease of a voltage difference across functional circuit 150. The decreased voltage difference results in less current consumed by functional circuit 150. Accordingly, such a method for measuring current through functional circuit 150 may change the amount of current used, thereby resulting in an inaccurate power measurement. In addition, the sense resistor may cause an overall increase in the amount of power consumed by integrated circuit 100.

To avoid changing the amount of current used by functional circuit 150, a non-invasive power measurement technique is disclosed that utilizes test circuit 110 to determine power consumption of functional circuit 150. As illustrated, test circuit 110 uses test power switch 115 to estimate a current flowing through in-circuit power switch 105, and, therefore, a current flowing into functional circuit 150. Both in-circuit power switch 105 and test power switch 115 include one or more transconductance devices, such as metal-oxide-semiconductor field-effect transistors (MOSFETs) or fin field-effect transistors (FinFETs). These transconductance devices enable or restrict a current flow based, at least in part, on a signal applied to a control terminal of the transconductance devices, such as a gate terminal of a MOSFET or FinFET. When an open signal (e.g. a first voltage level) is applied to the control terminal to place a device into the open state, a resistance between input and output terminals (e.g., source and drain terminals of a p-channel MOSFET) is high, thereby restricting an amount of current that flows through the device for a given voltage difference across the device. Applying a close signal (e.g., a second voltage level, different from the first) to the control terminal places the device into the closed state, thereby reducing the resistance by multiple orders of magnitude, allowing a much greater amount of current to flow through the device for a same voltage difference.

While in the closed state, the transconductance devices still retain some amount of resistance, commonly referred to as an on-resistance. This on-resistance creates a voltage difference across the transconductance devices when in-circuit power switch 105 or test power switch 115 are in the closed state, the amount of the voltage difference being proportionate to the amount of current flowing through the respective switches. Test circuit 110, therefore, may determine a current flowing through in-circuit power switch 105 based on a measured voltage difference between power supply 130 and local power node 132 if the on-resistance of in-circuit power switch 105 is known.

To determine a power consumption of functional circuit 150, test circuit 110, as shown, is configured to determine operating characteristics of test power switch 115. The determined characteristics include, for example, an on-resistance and a threshold voltage for test power switch 115. To determine the characteristics, test circuit 110 is configured to close test power switch 115 by applying a close signal to control terminal 117 of test power switch 115 to enable the closed state, and then to measure a voltage difference across test power switch 115, from input terminal 116 to output terminal 118, while a particular amount of current passes through test power switch 115. In some embodiments, sensor 140 is a current sensor, and test circuit 110 enables the closed state and current flows through test power switch 115 and through sensor 140. A value of the current may be read from sensor 140 while test circuit 110 measures voltage levels of input terminal 116 and output terminal 118. Using the difference between the measured voltage levels of input terminal 116 and output terminal 118 and the current sensed by sensor 140, the on-resistance of test power switch 115 is determined.

It is noted that sensor 140, in various embodiments, may be included in integrated circuit 100 or may be external to integrated circuit 100 and coupled to test power switch 115 using a pad structure of integrated circuit 100. When coupled externally, sensor 140 may be included on a test fixture that integrated circuit 100 is physically in contact with or included in automate test equipment that is coupled to a test fixture. Additional details regarding test fixtures and test equipment are disclose below in regards to FIG. 4.

Test power switch 115 is a replica of in-circuit power switch 105. In some embodiments, test power switch 115 is implemented such that it has electrical characteristics that replicate the electrical characteristics of in-circuit power switch 105. To achieve such replicated electrical characteristics, physical properties such as channel lengths and widths of test power switch 115 are designed using the same parameters as those of in-circuit power switch 105. Accordingly, when fabricated on integrated circuit 100 along with in-circuit power switch 105, test power switch 115 has electrical characteristics, such as an on-resistance and a threshold voltage, that correlate to in-circuit power switch 105. An on-resistance for in-circuit power switch 105, therefore, can be estimated based on the determined on-resistance for test power switch 115.

It is noted that, although test power switch 115 and in-circuit power switch 105 are designed using the same parameters, some differences in the respective electrical characteristics may be observed due to manufacturing variations. These differences may be maintained within an acceptable range of variance by enforcing a particular set of tolerances in the fabrication process.

Test circuit 110 is, as illustrated, further configured to measure a voltage difference across in-circuit power switch 105. Using measurement circuits, such as an analog-to-digital converter circuit, for example, test circuit 110 measures voltage levels of power supply 130 and local power node 132, both in reference to ground reference 134. Test circuit 110 determines the voltage difference across in-circuit power switch 105 by subtracting the two voltage measurements.

Using the characteristics of test power switch 115 (e.g., the determined on-resistance) and the voltage difference across in-circuit power switch 105, test circuit 110, as illustrated, is further configured to determine a power consumption of the functional circuit. Current through in-circuit power switch 105 may be estimated by dividing the voltage difference by the determined on-resistance for test power switch 115. If all current flowing through in-circuit power switch 105 goes to functional circuit 150, then the power consumption of functional circuit 150 can be determined by multiplying the current by the voltage level of local power node 132.

By using a test power switch that is implemented on a same integrated circuit die as a corresponding in-circuit power switch, characteristics of the two power switches may be sufficiently similar to estimate a current flowing through the in-circuit power switch based on measurements of the test power switch, thereby eliminating use of an invasive current sensing device between the power supply node and the functional circuit that draws power via the in-circuit power switch. In addition to having characteristics that are similar to the in-circuit power switch, placing the test power switch in the same integrated circuit results in circuit fabrication variations and temperature variations having a similar impact to those characteristics for both switches. Accordingly, if the voltage difference across the in-circuit power switch is measured in a same time frame as the characteristics of the test power switch are determined, then any effects from a variance in the die temperature may have similar effects to an on-resistance for both power switches, thereby maintaining an integrity of the power estimation.

It is noted that integrated circuit 100 as illustrated in FIG. 1 is merely an example. The illustration of FIG. 1 has been simplified to highlight features relevant to this disclosure. Various embodiments may include different configurations and/or different numbers of the circuit blocks. For example, a single functional circuit is show coupled to a single in-circuit power switch. In other embodiments, a plurality of functional circuits may be included, coupled to respective ones of in-circuit power switches. Similar methods may be employed to determine a power consumption of any particular one of the additional functional circuits.

Figure 2:
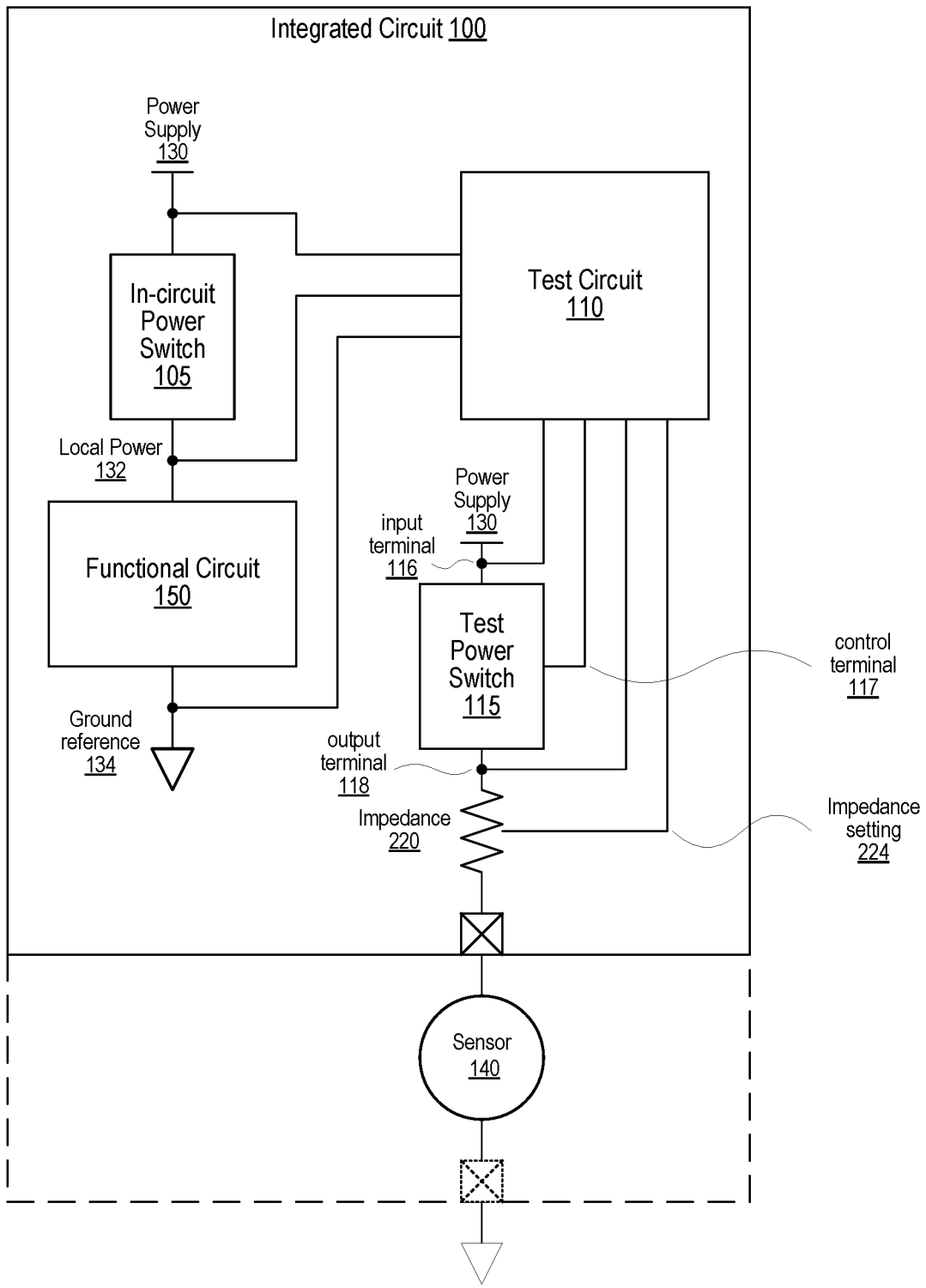
FIG. 2 shows a block diagram of another embodiment of an integrated circuit.

Determination of power consumption of a functional circuit is described in regards to FIG. 1. The described technique determines power consumption while the functional circuit is powered by closing the in-circuit power switch. It may also be desirable to determine a leakage current of the functional circuit when the functional circuit is powered off by opening the in-circuit power switch. FIG. 2 and the related description below depict such a technique.

Moving to FIG. 2, a block diagram of another embodiment of integrated circuit 100 from FIG. 1 is shown. As shown in FIG. 2, impedance 220 is added to integrated circuit 100. Impedance 220 is coupled between test power switch 115 and sensor 140. A control terminal for impedance 220 (impedance setting 224) is coupled to test circuit 110.

As disclosed above, test circuit 110 is configured to use test power switch 115 as part of a technique for determining power consumption of functional circuit 150. As illustrated in FIG. 2, test circuit 110 is also configured to determine a leakage current flowing through in-circuit power switch 105 and functional circuit 150. To perform a leakage measurement, test circuit 110 is configured to determine a set of leakage current measurements for test power switch 115 using a corresponding set of voltage levels applied across test power switch 115. As disclosed above, test power switch 115 is a replica of in-circuit power switch 105 that is also included in integrated circuit 100. Accordingly, leakage characteristics of test power switch 115 may correlate with leakage characteristics of in-circuit power switch 105.

To apply a particular voltage level across test power switch 115, test circuit 110, as shown, applies an open signal to control terminal 117 of test power switch 115, placing the switch in the open state. Input terminal 116 of test power switch 115 is coupled to power supply 130. Impedance 220, coupled to output terminal 118 of test power switch 115, is programmable, allowing a range of impedances to be selected between output terminal 118 and sensor 140. By using impedance setting 224 to vary the amount of impedance, a corresponding range of voltage levels may be generated on output terminal 118 of test power switch 115, the range of voltage levels being dependent on an amount of leakage current through test power switch. Using impedance setting 224, test circuit 110 adjust impedance 220 to each of a plurality of settings, and measures a corresponding voltage level of both input terminal 116 and output terminal 118 for each of the plurality of settings, thereby determining a set of voltage differences. In addition, sensor 140 is used to determine a current flowing through impedance 220, and therefore through test power switch 115, for corresponding ones of the set of voltage differences. This data may be stored in a memory circuit included within, or accessible to, test circuit 110.

Test circuit 110 is further configured to measure a voltage difference between input terminal 116 and output terminal 118 of in-circuit power switch 105. As described above, test circuit 110 uses measurement circuits to measure voltage levels of power supply 130 and local power node 132, both in reference to ground reference 134. Test circuit 110 determines the voltage difference across in-circuit power switch 105 by subtracting the two voltage measurements. Using the measured voltage difference across in-circuit power switch 105, test circuit 110 is also configured to select a particular leakage current measurement associated with the set of voltage differences measured across test power switch 115. The selection is made by choosing a leakage current measurement that corresponds to the one voltage difference of the set of voltage differences that is closest in value to the measured voltage difference.

Since the electrical characteristics of test power switch 115 replicate the electrical characteristics of in-circuit power switch 105, test circuit 110 may determine a leakage current through in-circuit power switch 105 by using the particular leakage current measurement. In some embodiments, test circuit 110 may use a value of the particular leakage current as a value of the leakage current of in-circuit power switch 105 without any adjustments. In other embodiments, the value of the leakage current of in-circuit power switch 105 may be adjusted from the value of the particular leakage current based on a difference in value between the measured voltage difference across in-circuit power switch 105 and the corresponding voltage difference of the set.

In some cases, two leakage current measurements, corresponding to two voltage differences of the set may be selected, where one of the voltage differences of the set is less than the measured voltage difference of in-circuit power switch 105 and the other voltage difference of the set is greater than the measured voltage difference. Using the two pairs of leakage currents and voltage differences, test circuit 110 is configured to determine the value for the leakage current of in-circuit power switch 105.

Variations of the described technique are contemplated. For example, in some embodiments, test circuit 110 may measure the voltage difference across in-circuit power switch 105 first, and then adjust impedance 220 until a voltage difference across test power switch 115 is the same as (or within an acceptable tolerance of) the measured voltage difference across in-circuit power switch 105. The current that flows through impedance 220 and test power switch 115 is measured by sensor 140 and may then be used to determine the corresponding leakage current through in-circuit power switch 105 and functional circuit 150.

It is noted that the embodiment of FIG. 2 is merely an example to demonstrate the disclosed concepts. In other embodiments, a different combination of circuits may be included or the illustrated circuits may be arranged differently. For example, in the illustrated embodiment, impedance 220 is shown coupled between test power switch 115 and sensor 140. In other embodiments, impedance 220 may be coupled between power supply 130 and test power switch 115.

FIGS. 1 and 2 illustrate block diagrams of integrated circuits that include test circuits that are used to determine a current through an in-circuit power switch by using a test power switch that replicates electrical characteristics of the in-circuit power switch. Examples of an in-circuit power switch and a test power switch, along with example characteristics, are depicted in FIG. 3.

Turning to FIG. 3, block diagrams are shown for embodiments of an in-circuit power switch and for a plurality of test power switches that may be included on an integrated circuit. In-circuit power switch 105 includes a plurality of switching elements 305, each coupled to power supply 130, local power node 132, and switch control terminal 335. Test power switches 115 include four separate test power switches 115a-115d. Input terminals 116a-116d for test power switches 115 are coupled to each other, while control terminals 117a-117d are coupled to respective enable signals, test switch enables 340a-340d, and output terminals 118a-118d are coupled to respective ones of impedances 220a-220d (collectively impedances 220). Impedances 220 include respective control terminals, impedance settings 224a-224d. In addition, FIG. 3 includes a chart illustrating two waveforms associated with characteristics of power switches. The waveforms of chart 360 include drain-to-source resistance values corresponding to gate voltages for test power switches 115a and 115b.

As illustrated, integrated circuit 100 includes a plurality of test power switches 115. Respective characteristics differ among test power switches 115, such that ones of test power switches 115 have different characteristics from other test power switches 115. In FIG. 3., the in-circuit and test power switches are depicted as including p-channel MOSFET devices, although other types of transconductance devices may be used in other embodiments. MOSFET devices include at least three terminals, an input terminal (for a p-channel MOSFET device, the source), an output terminal (the drain) and a control terminal (the gate). A voltage difference between the gate and the source controls an amount of resistance between the drain and the source. A threshold voltage for the power switches refers to a source-to-gate voltage level at which the power switch transitions between the open state and the closed state. A source-to-gate voltage level greater than the threshold voltage places a power switch in the closed state, allowing current to flow and vice versa for a source-to-gate voltage level less than the threshold voltage. As is shown in chart 360, the drain-to-source resistance for a MOSFET may vary considerably for gate voltages near the threshold voltage of a device. Accordingly, a closed signal may be configured to have a voltage level as low as is practical while an open signal may be configured to be as high as is practical, thereby avoiding potentially unpredictable behavior of a power switch operating near its threshold voltage. The drain-to-source resistance of a power switch with a closed signal applied to the gate is referred to herein as the "on-resistance" of the switch. Conversely, drain-to-source resistance of a power switch with an open signal applied to the gate is referred to herein as the "off-resistance" of the switch.

Chart 360 depicts waveforms illustrating to drain-to-source resistance values for respective gate voltages for test power switches 115a and 115b. Test power switch 115a is shown to have a greater drain-to-source resistance than test power switch 115b at gate voltages above threshold voltage 316a, and therefore has a higher off-resistance than test power switch 115b. Test power switch 115b, however, is shown to have a lower drain-to-source resistance than test power switch 115a at gate voltages below threshold voltage 316b, and therefore has a lower on-resistance than test power switch 115a. A lower on-resistance may be desirable in some situations to increase an amount of current flowing through a power switch when the switch is closed. A higher off-resistance may be desirable in certain situations to reduce an amount of leakage current when the switch is open.

Accordingly, circuit designers may utilize different power switch designs for use with various different functional circuits depending on desired performance parameters. For example, to power a functional circuit that is not enabled often or that is prone to having high leakage currents when disabled, a power switch with a high off-resistance may be selected to reduce leakage currents while the functional circuit is disabled. In contrast, to power a functional circuit that will be enabled frequently or that has a high current consumption when enabled, a power switch with a low on-resistance may be selected to reduce a voltage drop across the switch while the circuit is enabled. If more than one power switch design is used for in-circuit power switches in an integrated circuit, then more than one test power switch may be included to correspond to the various in-circuit power switches.

In the embodiment illustrated in FIG. 3, four test power switches 115 are included. To determine some of the characteristics of test power switches 115, test circuit 110, from FIGS. 1 and 2, is further configured to enable, using respective test switch enables 340a-340d, a particular one of test power switches 115 and measure voltages and/or currents associated with the particular test power switch. For example, to determine an on-resistance of test power switch 115a, test circuit 110 is configured to assert a close signal on test switch enable 340a and then measure voltage levels of input terminal 116a and output terminal 118a. In addition, sensor 140, from FIGS. 1 and 2, may be configured to measure current flowing through test power switch 115a. Using a difference in the voltage measurements of input terminal 116a and output terminal 118a and the measured current, the on-resistance can be determined. Such a procedure may be repeated for some or all of the remaining test power switches 115. The determined values for the evaluated ones of test power switches 115 may be stored for a duration of a current test operation in a volatile memory circuit, or stored for a longer duration in a non-volatile memory circuit.

To use the determined characteristics of test power switches 115, test circuit 110 is configured to select a corresponding test power switch from test power switches 115 that most closely corresponds to in-circuit power switch 105. For example, if in-circuit power switch 105 was designed using the same design parameters as test power switch 115a, then test power switch 115a is selected using, for example, a lookup table that maps various in-circuit power switches included in integrated circuit 100 to corresponding ones of test power switches 115. Such a lookup table may, in some embodiments, be stored in a non-volatile memory accessible by test circuit 110. In other embodiments, information indicating a mapping between in-circuit power switches and test power switches may be maintained external to integrated circuit 100 and downloaded to test circuit 110 or to a memory on integrated circuit 100 as part of a test initialization procedure. After the appropriate one of test power switches 115 is selected, test circuit 110 may determine a current through in-circuit power switch 105 following the procedure described above in regards to FIG. 1 and using the value of on-resistance determined for the selected one of test power switches 115.

Test circuit 110 is also configured to determine leakage currents through two or more of test power switches 115. For example, test circuit 110 may be configured to apply a set of voltage levels across test power switch 115a. Power supply

130 may be coupled to input terminals 116a-116d, thereby providing a first voltage level to input terminals 116a-116d. Test circuit 110 is also configured to assert an open signal on test switch enable 340d and to adjust impedance setting 224a such that impedance 220a causes a particular voltage level on output terminal 118a. As illustrated, test circuit 110 measures the voltage levels of input terminal 116a and output terminal 118a, and sensor 140 measures current flowing through test power switch 115a. This procedure is repeated for additional values of impedance setting 224a such that, for test power switch 115a, a set of different voltage differences are measured along with corresponding set of leakage currents. Test circuit 110 is further configured to repeat the leakage measurements for one or more of the other test power switches 115, generating respective sets of voltage differences and sets of leakage current measurements.

Impedances 220 may be implemented using a variety of designs. In some embodiments, a given one of impedances 220 may be implemented as a series of resistors with a plurality of switches to select and to bypass various combinations of the series, allowing a variety of resistance values to be achieved. In other embodiments, a given one of impedances 220 may be implemented as one or more biased MOSFETs. For example, as shown in chart 360, a voltage of a gate terminal of a MOSFET may be adjusted to produce a range of drain-to-source resistances.

Test circuit 110 is further configured to select a particular set of the leakage current measurements from the respective sets, based on a similarity of a particular one of test power switches 115 to in-circuit power switch 105. As described above, test circuit 110, in some embodiments, may access a lookup table to determine which of test power switches 115 was designed with the same design parameters as in-circuit power switch 105. After the appropriate one of test power switches 115 is selected, test circuit 110 may estimate, using the set of leakage current measurements associated with the selected one of test power switches 115, a leakage current through in-circuit power switch 105 following the procedure described above in regards to FIG. 2.

FIG. 3 further illustrates an example of in-circuit power switch 105. As shown, in-circuit power switch 105 includes a particular number (five) of switching elements 305. Switching elements 305 are coupled in parallel, with respective source terminals coupled to power supply 130 and their respective drain terminals coupled to local power node 132. The respective gate terminals are coupled to a same switch control terminal 335 such that all of switching elements 305 may be placed into open or closed states in parallel. Use of multiple switching elements 305 may increase an amount of current that in-circuit power switch 105 can supply to functional circuit 150. The multiple switching elements 305 may also reduce a total on-resistance of in-circuit power switch 105, thereby reducing a voltage drop across in-circuit power switch 105 for a given amount of current consumed by functional circuit 150.

One of switching elements 305 may correspond to a particular one of test power switches 115. For example, each of switching elements 305 may be designed using a same set of design parameters. Test power switch 115a may be the one of test power switches 115 that is designed using the same set of design parameters, such that electrical characteristics of test power switch 115a replicate the electrical characteristics of each of switching elements 305. In other embodiments, switching elements 305 may be designed with two or more sets of design parameters, each of the two or more sets corresponding to a respective one of test power switches 115. For example, switching elements 305a-305c may be mapped to test power switch 115a while switching elements 305d-305e correspond to test power switch 115d.

In the present example, each of switching elements 305 are mapped to test power switch 115a. To use the characteristics of test power switch 115a, test circuit 110 is further configured to adjust the characteristics using the particular number, five as shown. For example, to determine a leakage current through in-circuit power switch 105, test circuit 110 is configured to multiply a particular one of the set of leakage current measurements associated with test power switch 115a by the particular number. If the particular leakage current associated is 10 microamperes (μA), then a leakage current for the combination of five switching elements 305 included in in-circuit power switch 105 may be determined by 10 μA×5=50 μA.

It is noted that FIG. 3 is merely an example to demonstrate the disclosed concepts. In other embodiments, the waveforms of chart 360 may appear different due to circuit designs used to implement test power switches 115, manufacturing limitations creating less than ideal devices, temperature an power variations, and the like. Although five switching elements and four test power switches are shown, any suitable numbers may be implemented.

Figure 4:
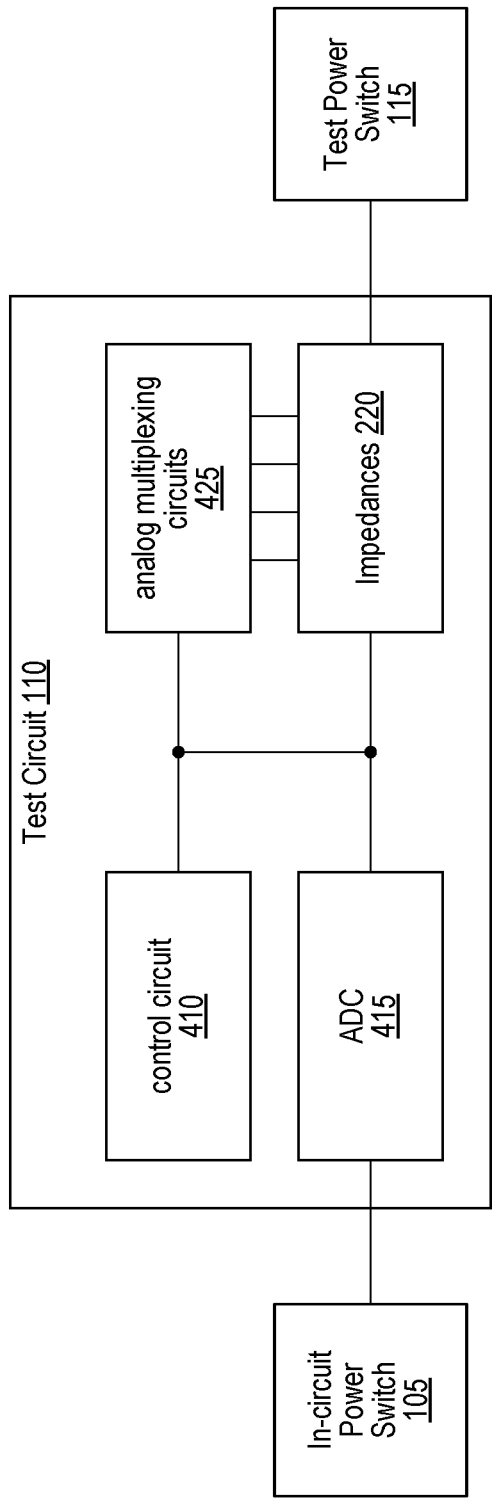
FIG. 4 shows a block diagram of an embodiment of a test circuit included in an integrated circuit.

FIGS. 1 and 2 illustrate an integrated circuit that includes a test circuit. Test circuits may be implemented utilizing various designs to implement various testing procedures. FIG. 4 illustrates one such implementation.

Proceeding to FIG. 4, a block diagram of a test circuit included in an integrated circuit is illustrated. Test circuit 110 includes control circuit 410, analog multiplexing circuits 425, analog-to-digital converter circuit (ADC) 415, and impedances 220. Test circuit 110 is coupled to in-circuit power switches 105 and test power switches 115. As shown, test circuit 110 is an example implementation for test circuit 110 in FIGS. 1 and 2.

Test circuit 110 is described above as being used to measure voltages and currents associated with in-circuit power switch 105 and test power switch 115. Test circuit 110 includes a variety of circuits to perform these measurements. Control circuit 410, in various embodiments, includes combinational logic, a state machine, a processing core, or a combination thereof to generate control signals to the other circuit blocks included in test circuit 110. Control circuit 410 may further include an interface for exchanging information and/or receiving commands from other test circuitry included within or external to integrated circuit 100.

To determine an on-resistance of test power switch 115, control circuit 410 is configured, as illustrated, to select a particular channel of analog multiplexing circuits 425 to couple ADC 415 to an input terminal of test power switch 115, assert a close signal on a control terminal of test power switch 115, and couple an output terminal of test power switch 115 to sensor 140 (as shown in FIG. 1). Control circuit 410 may assert a ready signal to trigger sensor 140 to measure current from test power switch 115 and to trigger ADC 415 to measure a voltage level of the input terminal. Control circuit 410 also selects a different channel of analog multiplexing circuits 425 to couple ADC 415 to the output terminal of test power switch 115 and asserts a second trigger to measure the voltage level of the output terminal. Control circuit 410 may further generate a set of impedance setting signals to adjust a selected one of impedances 220 to various impedance values to generate a set of voltage level differences across test power switch 115 when performing leakage current measurements.

As illustrated, ADC 415 may be implemented using any suitable analog-to-digital converter design, such as a successive approximation ADC, a sigma-delta ADC, a single-slope or multi-slope integrating ADC, and the like. ADC 415 receives and samples an analog signal with a voltage level that is between a lower and upper voltage rail of ADC 415. ADC 415 determines a digital value that is indicative of the voltage level of the analog signal at the time the signal is sampled. The determined value is then provided to control circuit 410.

Analog multiplexing circuits 425, as shown, include a suitable number of multiplexing circuits (commonly referred to as MUXs) for coupling various nodes to an input of ADC 415 so a voltage level of the node can be measured. Analog multiplexing circuits 425 may also include MUXs for coupling sensor 140 to a particular output terminal of a selected test power switch 115 or to a node associated with a particular one of impedances 220. Control circuit 410 may use analog multiplexing circuits 425 to couple input and output terminals of in-circuit power switch 105 to ADC 415 to measure a voltage difference across in-circuit power switch 105.

FIG. 4, it is noted, is one example of an embodiment of a test circuit that is included in an integrated circuit. The diagram has been simplified to highlight discussed features. In other embodiments, additional circuits may be included, such as a memory circuit for storing measured values and/or a lookup table for mapping in-circuit power switches to corresponding ones of test power switches.

Figure 5:
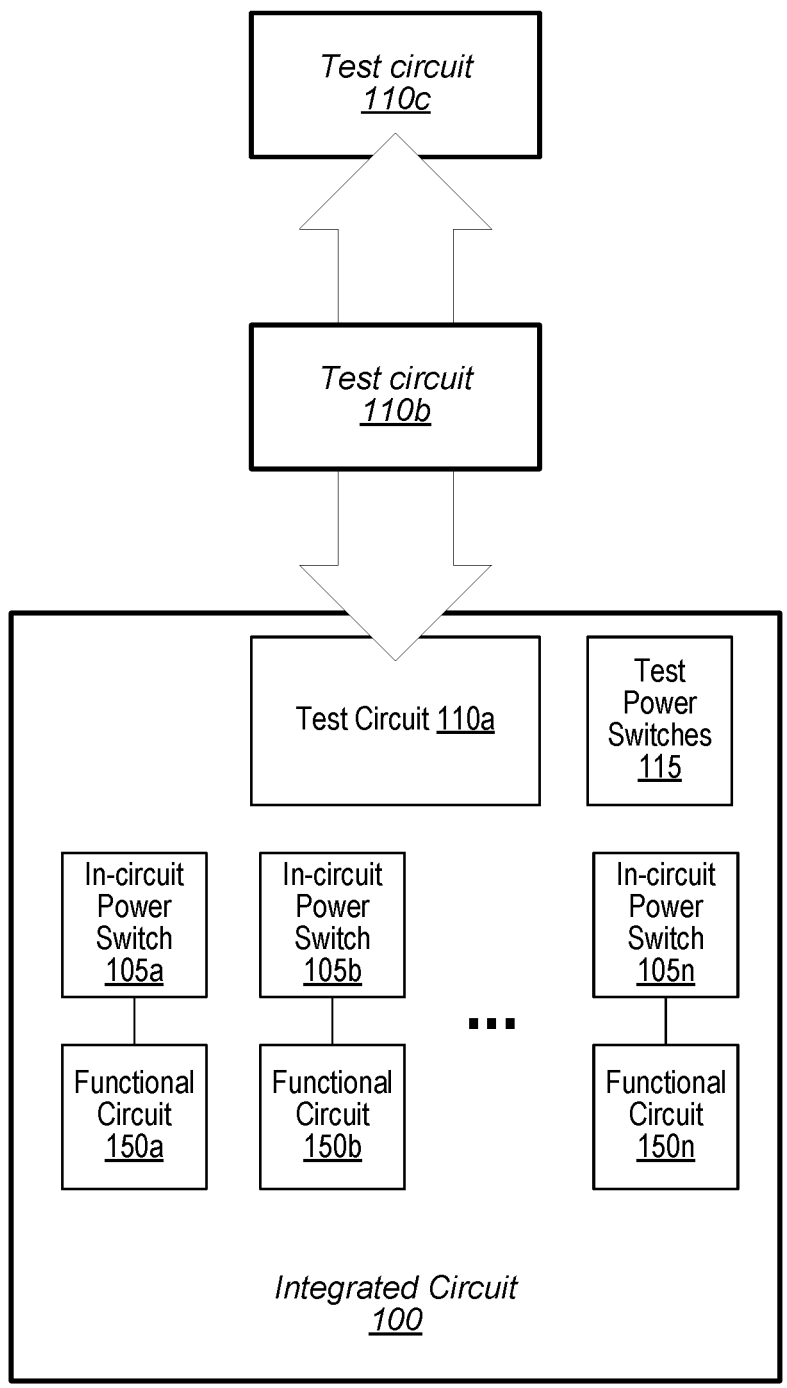
FIG. 5 illustrates a block diagram of a system for testing an integrated circuit.

FIGS. 1-2 have illustrated an integrated circuit that includes a test circuit for determining current through an in-circuit power switch. During testing, this integrated circuit may be placed into a testing system that includes additional circuitry and other hardware and/or software that is used to perform test on the integrated circuit. FIG. 5 illustrates an example of a testing system.

Moving now to FIG. 5, a testing system for testing performance of an integrated circuit, including performance of an in-circuit power switch, is depicted. Testing system 500 includes integrated circuit 100, which further includes test circuit 110*a*. Integrated circuit 100 is coupled to test circuit 100*b* which, in turn, is coupled to test circuit 110*c*. Integrated circuit 100 includes a plurality of functional circuits 150*a*-150*n* (collectively 150) that are coupled to power supplies via respective ones of in-circuit power switches 105*a*-105*n* (collectively 105). Test circuit 110*a*, as shown, may be used to perform one or more test operations on any suitable number of functional circuits 150, such as by performing power consumption or leakage current measurements on a selected one of functional circuits 150.

Testing of an integrated circuit includes use of hardware, and in some cases, software, external to the integrated circuit. For example, an IC may receive power signals, clock signals, control signals, or a combination thereof from test circuits external to the IC. As illustrated, integrated circuit 100 is coupled to external hardware that includes test circuit 110*b*. In some embodiments, test circuit 110*b* may be included in a computing device that integrated circuit 100 is also included in, such as a desktop or laptop computer, a smartphone, a tablet computer, a wearable device, a smart-home device, and the like. In other embodiments, test circuit 110*b* may be included in a test interface used in a production facility to test integrated circuit 100 before it is installed into a larger product.

In these various embodiments, test circuit 110*b* may include circuits external to integrated circuit 100 that are used to interface with test circuit 110*a* which is included in integrated circuit 100. For example, test circuit 110*b* may include a communication interface to exchange information with test circuit 110*a*. In such an example, test circuit 110*b* may send instructions to test circuit 110*a* to perform a leakage current measurement on the combination of in-circuit power switch 105*b* and functional circuit 150*b*. Test circuit 110*a* may then send data collected from the leakage current measurement back to test circuit 110*b*. Test circuit 110*b* may also provide mapping information for selecting a particular one of test power switches 115 for use with in-circuit power switch 105*a*.

As illustrated, test circuit 110*b* is also coupled to test circuit 110*c*. In some embodiments, test circuit 110*c* is automated test equipment (ATE) used to products, such as test integrated circuits and/or computing devices, in a production manufacturing flow prior to the products' use or sale. In other embodiments, test circuit 110*c* may be a computer or network of computer systems used to collect test results that have been collected by test circuit 110*b*. Test circuit 110*c* may include a test program that indicates a plurality of test operations to perform on integrated circuit 100 including, for example, a leakage current measurement, as well as a power consumption measurement, for each of functional circuits 150. Test circuit 110*c* may collect and analyze results of various power and current measurements and further provide an indication whether integrated circuit 100 passes the test.

It is noted that operations are described above in regards to FIGS. 1-4 and are attributed to test circuit 110. In various embodiments, such operations may be implemented by test circuit 110*a* only, by test circuit 110*a* and 110*b*, or by a combination of test circuits 110*a*-110*c*. For example, operations associated with the power consumption and leakage current measurements may be performed by test circuit 110*a* as part of a built-in self-test (BIST) included in integrated circuit 100. In other embodiments, some of the disclosed operations, such as current measurements performed by sensor 140, in FIGS. 1 and 2, may be performed in test circuit 110*b* after test circuit 110*a* selects and configures a particular combination of in-circuit power switches 105 and functional circuits 150.

It is further noted that FIG. 5 is a simplified example of a testing system. In other embodiments, additional hardware and/or software blocks may be included. Some embodiments of a testing system may not include both test circuit 110*b* and test circuit 110*c*.

The circuits described above in FIGS. 1-5 may perform power consumption and leakage current measurements using a variety of methods. Two such methods, one for performing a power consumption measurement of a functional circuit, and the other for performing a leakage current measurement of a functional circuit, are described in FIGS. 6 and 7.

Turning now to FIG. 6, a flow diagram for an embodiment of a method for performing a power consumption measurement of a functional circuit is shown. Method 600 may be performed by a test circuit, for example, test circuit 110 in FIG. 1. Referring collectively to FIGS. 1 and 6, method 600 begins in block 601 to perform a power measurement of functional circuit 150.

At block 610, method 600 includes measuring, by test circuit 110, characteristics of test power switch 115 included in integrated circuit 100. As shown, test power switch 115 is a replica of in-circuit power switch 105 included in integrated circuit 100. Within the manufacturing capabilities used to create integrated circuit 100, electrical characteristics of test power switch 115 mimic electrical characteristics of in-circuit power switch 105. The measured characteristics of test power switch 115 include for example, an on-resistance, a threshold voltage, and the like. In some embodiments, test circuit 110 measures respective characteristics of a plurality of test power switches 115 such as shown in FIG. 3. In such embodiments, respective characteristics differ among the plurality of test power switches 115.

In some embodiments, measuring the characteristics of test power switch 115, includes placing test power switch 115 in a closed state by asserting a close signal on control terminal 117 of test power switch 115, and setting an adjustable impedance (e.g., impedance 220 in FIG. 2) to cause a particular amount of current to flow through the closed test power switch 115. With the particular amount of current flowing through test power switch 115, a particular set of voltage levels are measured, including voltage levels of input terminal 116 and output terminal 118 of the closed test power switch 115. In some embodiments, after measuring the particular set of voltage levels, the method includes causing a different amount of current to flow through the closed test power switch 115, and then measuring a different set of voltage levels of input terminal 116 and output terminal 118. The characteristics of test power switch 115 are then determined using the particular set of voltage levels and the different set of voltage levels. For example, two on-resistance values may be created, one using the particular set of voltage levels and the other using the different set of voltage levels. The two on-resistance values may be averaged to generate a single on-resistance value. In other embodiments, both on-resistance values may be stored, along with data associated with the respective set of voltage levels used to generate the corresponding on-resistance value.

Method 600 further includes, at block 620, measuring, by the test circuit, voltage levels of one or more terminals of in-circuit power switch 105. As shown, test circuit 110 measures a respective voltage level for an input terminal and an output terminal of in-circuit power switch 105. These voltage level measurements are taken while in-circuit power switch is in a closed state. In some embodiments, functional circuit 150 may be placed into a particular operating state before the voltage level measurements are made.

At block 630, method 600 further includes determining, by test circuit 110, a current through in-circuit power switch 105 using the characteristics of test power switch 115 and the measured voltage levels. For example, test circuit 110 determines the current through in-circuit power switch 105 by estimating a value for the on-resistance for in-circuit power switch 105 using the on-resistance determined for test power switch 115. The current is determined using the estimated value of the on-resistance and a difference between the measured voltage levels.

In embodiments for which integrated circuit 100 includes a plurality of test power switches, test circuit 110 selects respective characteristics of a particular one of test power switches 115 based on a similarity of the selected test power switch 115 to in-circuit power switch 105. For example, test circuit 110 may access a look-up table that maps a plurality of in-circuit power switches included in integrated circuit 100 to a closest matching one of test power switches 115.

Method 600, at block 640, further includes, estimating, by test circuit 110 using the determined current, a power consumption of functional circuit 150 coupled to in-circuit power switch 105. If a current consumed by functional circuit 150 and a voltage level across functional circuit 150 are both known, then a power consumption can be calculated by multiplying the voltage level by the current. If functional circuit 150 is the only active circuit coupled to in-circuit power switch 105, then the current determined in block 630 is the current consumed by functional circuit 150. In addition, the voltage level of the output terminal of in-circuit power switch may correspond to the voltage level across functional circuit 150. Accordingly, the power consumption of functional circuit 150 is determined by multiplying the determined current by the measured voltage level. The method ends in block 690. In various embodiments, some or all operations of method 600 may be repeated to, for example, measure power of functional circuit 150 for different operating states, or to measure power consumption for a different functional circuit coupled to a different in-circuit power switch.

Figure 7:
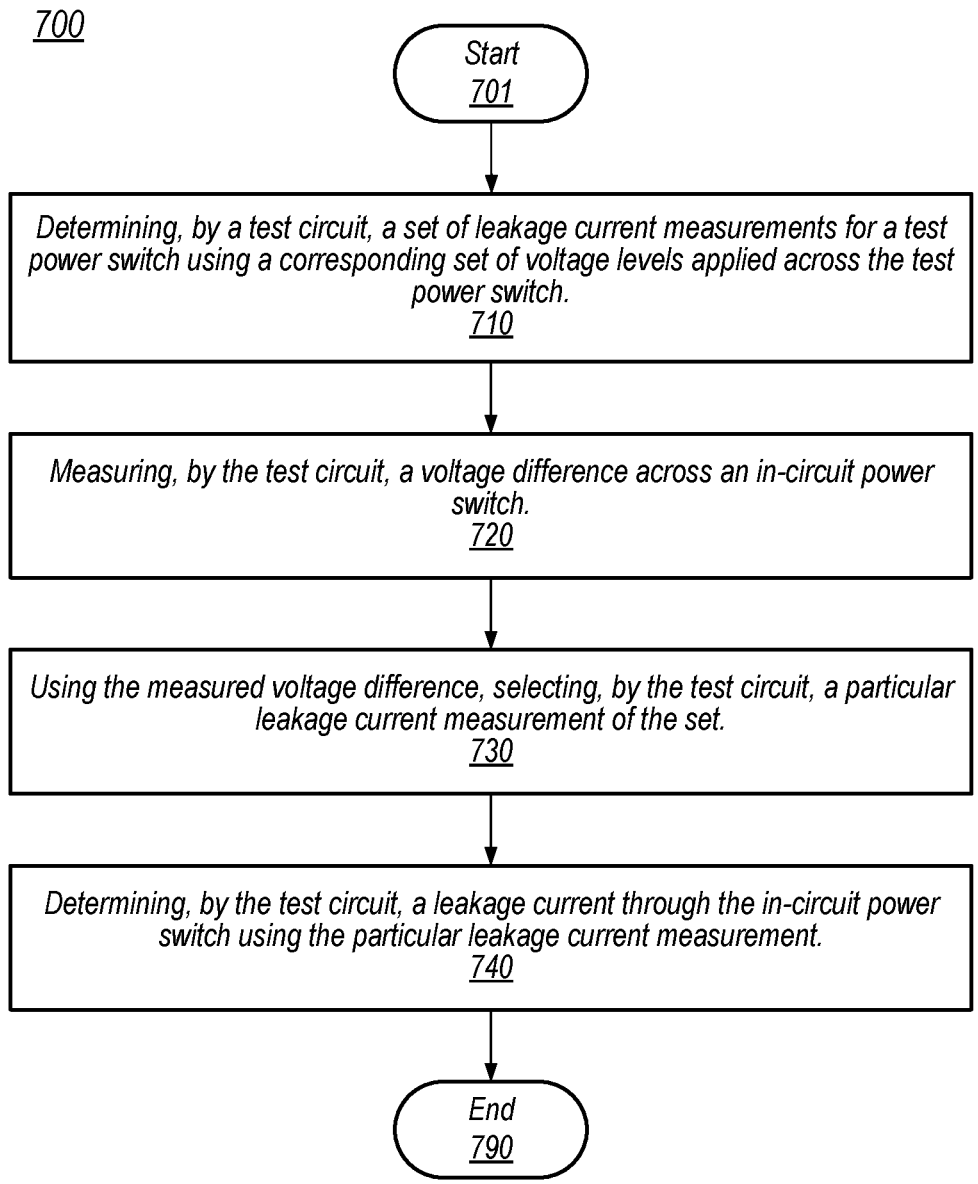
FIG. 7 depicts a flow diagram of an embodiment of a method for determining leakage current through a power switch coupled to a functional circuit.

Proceeding now to FIG. 7, a flow diagram for an embodiment of a method for performing a leakage current measurement of a functional circuit is shown. As illustrated, method 700 may be performed by a test circuit, for example, test circuit 110 shown in FIG. 2. Referring collectively to FIGS. 2 and 7, method 700 begins in block 701 to perform a leakage current measurement of functional circuit 150.

At block 710, method 700 includes determining, by test circuit 110, a set of leakage current measurements for test power switch 115 using a corresponding set of voltage levels applied across test power switch 115. As illustrated, test circuit 110 opens test power switch 115 by applying an open signal to a control terminal of test power switch 115. The corresponding set of voltage levels are applied using programmable impedance 220 coupled to test power switch 115. In some embodiments, a setting for impedance 220 is adjusted while measuring a voltage level of input terminal 116 and output terminal 118 until a particular voltage difference across test power switch 115 is detected. In other embodiments, a set of predetermined settings for impedance 220 are utilized, and the voltage levels of input terminal 116 and output terminal 118 are measured. After the voltage across test power switch 115 is determined, a current flowing through test power switch 115 and impedance 220 is measured using sensor 140. Test circuit 110 receives the measured current and stores the measured current value along with a value indicative of the voltage difference across test power switch 115. The procedure is repeated for other settings of impedance 220 to generate other ones of the set of voltage levels, each time measuring a corresponding one of the set of current measurements.

In some embodiments, integrated circuit 100 includes a plurality of test power switches 115, the plurality of test power switches 115 having different characteristics from one another. In such embodiments, the current measurement procedure is repeated for two or more selected ones of test power switches 115. Accordingly, each selected test power switch 115 is opened, a set of voltage levels across each of the selected test power switches 115 is applied, and respective sets of leakage current measurements are determined for each of the selected test power switches 115. Accordingly, for each selected test power switch 115, a set of voltage levels and a corresponding set of current measurements are made and stored.

Method 700 further includes, at block 720, measuring, by test circuit 110, a voltage difference across in-circuit power switch 105. As shown in FIG. 2, a voltage level of an input terminal of in-circuit power switch 105 (e.g., power supply 130) and a voltage level of an output terminal of in-circuit power switch 105 (e.g., local power node 132) are measured. The voltage difference is determined by subtracting the measured voltage level of the output terminal from the measured voltage level of the input terminal.

At block 730, method 700 further includes selecting, by test circuit 110, a particular leakage current measurement of the set of leakage currents, using the measured voltage difference to make the selection. To select the particular leakage current measurement of the set using the measured voltage difference, a leakage current measurement that was measured with a closest applied voltage level to the measured voltage difference is selected. For example, the measured voltage difference from in-circuit power switch 105 to the set of voltage levels determined for test power switch 115 is compared. After a closest match is identified, the current measurement that corresponds to the identified one of the set of voltage levels is selected.

In embodiments that include a plurality of test power switches 115, a particular set of the leakage current measurements from the respective sets is selected based on a similarity of a particular test power switch 115 to in-circuit power switch 105. For example, test circuit 110 uses a look-up table as described above in regards to block 630 of method 600. Once a particular test power switch 115 is selected, the measured voltage difference from in-circuit power switch 105 is compared to the set of voltage levels determined for the particular test power switch 115, and the particular current measurement that corresponds to the closest match is selected.

Method 700 also includes, at block 740, determining, by test circuit 110, a leakage current through in-circuit power switch 105 using the particular leakage current measurement. In some embodiments, a value of the particular leakage current may be used as a value of the leakage current for in-circuit power switch 105. In other embodiments, test circuit 110 may adjust the value of the particular leakage value to determine the value of the leakage current for in-circuit power switch 105. For example, in some embodiments, in-circuit power switch 105 includes a particular number of identical (within fabrication limits) switching elements, such as switching elements 305 in FIG. 3. One of switching elements 305 may correspond to test power switch 115 and, therefore, to determine the leakage current through all switching elements 305 within in-circuit power switch 105, the particular leakage current measurement is multiplied by the particular number. As shown in FIG. 3, in-circuit power switch 105 includes five switching elements 305. If the particular leakage current measurement corresponds to a leakage current through one switching element 305, then multiplying the particular leakage current measurement by five may provide a sufficient estimation of the leakage current through in-circuit power switch 105, and therefore, the leakage current through functional circuit 150. The method ends in block 790. Method 700 may be repeated for additional functional circuits coupled to other in-circuit power switches, such as shown in FIG. 5.

It is noted that methods 600 and 700 of FIGS. 6 and 7 are merely examples. Variations of the disclosed methods are contemplated. For example, the test power switch is described as being measured before the in-circuit power switch. In other embodiments, voltages associated with the in-circuit power switch may be measured before voltages associated with test power switch 115.

Figure 8:
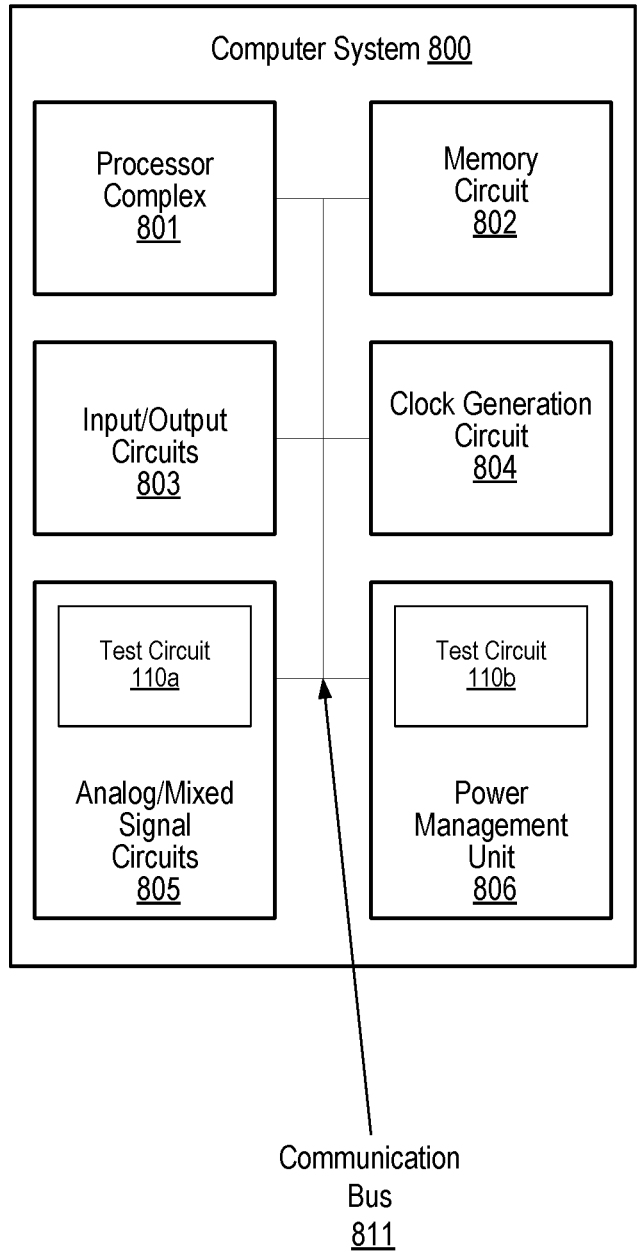
FIG. 8 depicts a block diagram of an embodiment of a computer system that includes a test circuit.

FIGS. 1-7 illustrate apparatus and methods for an integrated circuit that includes a test circuit. Integrated circuits, such as those described above, may be used in a variety of computer systems, such as a desktop computer, laptop computer, smartphone, tablet, wearable device, and the like. A block diagram illustrating an embodiment of computer system 800 is illustrated in FIG. 8. In some embodiments, computer system 800 corresponds to integrated circuit 100 in FIGS. 1 and 2, while in other embodiments, computer system 800 is a computer system that includes integrated circuit as well as other circuits. As shown, computer system 800 includes processor complex 801, memory circuit 802, input/output circuits 803, clock generation circuit 804, analog/mixed-signal circuits 805, and power management unit 806. These functional circuits are coupled to each other by communication bus 811. As shown, both analog/mixed-signal circuits 805 and power management unit 806 include respective embodiments of test circuit 110, as indicated by test circuits 110a and 110b, although test circuit 110 may be included in any suitable one of the illustrated circuit blocks. In some embodiments, only one implementation of test circuit 110 may be included, while in other embodiments, any number of the illustrated circuit blocks may include a respective test circuit 110.

Processor complex 801, in various embodiments, may be representative of a general-purpose processor that performs computational operations. For example, processor complex 801 may be a central processing unit (CPU) such as a microprocessor, a microcontroller, an application-specific integrated circuit (ASIC), or a field-programmable gate array (FPGA). In some embodiments, processor complex 801 may correspond to a special purpose processing core, such as a graphics processor, audio processor, or neural processor, while in other embodiments, processor complex 801 may correspond to a general-purpose processor configured and/or programmed to perform one such function. Processor complex 801, in some embodiments, may include a plurality of general and/or special purpose processor cores as well as supporting circuits for managing, e.g., power signals, clock signals, and memory requests. In addition, processor complex 801 may include one or more levels of cache memory to fulfill memory requests issued by included processor cores.

Memory circuit 802, in the illustrated embodiment, includes one or more memory circuits for storing instructions and data to be utilized within computer system 800 by processor complex 801. In various embodiments, memory circuit 802 may include any suitable type of memory such as a dynamic random-access memory (DRAM), a static random access memory (SRAM), a read-only memory (ROM), electrically erasable programmable read-only memory (EEPROM), or a non-volatile memory, for example. It is noted that in the embodiment of computer system 800, a single memory circuit is depicted. In other embodiments, any suitable number of memory circuits may be employed. In some embodiments, memory circuit 802 may include a memory controller circuit as well as communication circuits for accessing memory circuits external to computer system 800, such as a DRAM module.

Input/output circuits 803 may be configured to coordinate data transfer between computer system 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 803 may be configured to implement a version of Universal Serial Bus (USB) protocol or IEEE 1394 (Firewire®) protocol.

Input/output circuits 803 may also be configured to coordinate data transfer between computer system 800 and one or more devices (e.g., other computing systems or integrated circuits) coupled to computer system 800 via a network. In one embodiment, input/output circuits 803 may be configured to perform the data processing necessary to implement an Ethernet (IEEE 802.3) networking standard such as Gigabit Ethernet or 10-Gigabit Ethernet, for example, although it is contemplated that any suitable networking standard may be implemented.

Clock generation circuit 804 may be configured to enable, configure and manage outputs of one or more clock sources. In various embodiments, the clock sources may be located in analog/mixed-signal circuits 805, within clock generation circuit 804, in other blocks with computer system 800, or come from a source external to computer system 800, coupled through one or more I/O pins. In some embodiments, clock generation circuit 804 may be capable of enabling and disabling (e.g., gating) a selected clock source before it is distributed throughout computer system 800. Clock generation circuit 804 may include registers for selecting an output frequency of a phase-locked loop (PLL), delay-locked loop (DLL), frequency-locked loop (FLL), or other type of circuits capable of adjusting a frequency, duty cycle, or other properties of a clock or timing signal.

Analog/mixed-signal circuits 805 may include a variety of circuits including, for example, a crystal oscillator, PLL or FLL, and a digital-to-analog converter (DAC) (all not shown) configured to generated signals used by computer system 800. In some embodiments, analog/mixed-signal circuits 805 may also include radio frequency (RF) circuits that may be configured for operation with cellular telephone networks. Analog/mixed-signal circuits 805 may include one or more circuits capable of generating a reference voltage at a particular voltage level, such as a voltage regulator or band-gap voltage reference. As illustrated, analog/mixed-signal circuits 805 includes test circuit 110*a*. In various embodiments, test circuit 110*a* may be used to support testing of power switches within analog/mixed-signal circuits 805, or throughout computer system 800.

Power management unit 806 may be configured to generate a regulated voltage level on a power supply signal for processor complex 801, input/output circuits 803, memory circuit 802, and other circuits in computer system 800. In various embodiments, power management unit 806 may include one or more voltage regulator circuits, such as, e.g., a buck regulator circuit, configured to generate the regulated voltage level based on an external power supply (not shown). In some embodiments any suitable number of regulated voltage levels may be generated. Additionally, power management unit 806 may include various circuits for managing distribution of one or more power signals to the various circuits in computer system 800, including maintaining and adjusting voltage levels of these power signals. Power management unit 806 may include circuits for monitoring power usage by computer system 800, including determining or estimating power usage by particular circuits. Power management unit 806 includes test circuit 110*b* in the illustrated embodiment. As described for test circuit 110*a*, test circuit 110*b* may be used to support testing of power switches within power management unit 806, or test switches throughout computer system 800.

It is noted that the embodiment illustrated in FIG. 8 includes one example of a computer system. A limited number of circuit blocks are illustrated for simplicity. In other embodiments, any suitable number and combination of circuit blocks may be included. For example, in other embodiments, security and/or cryptographic circuit blocks may be included.

Figure 9:
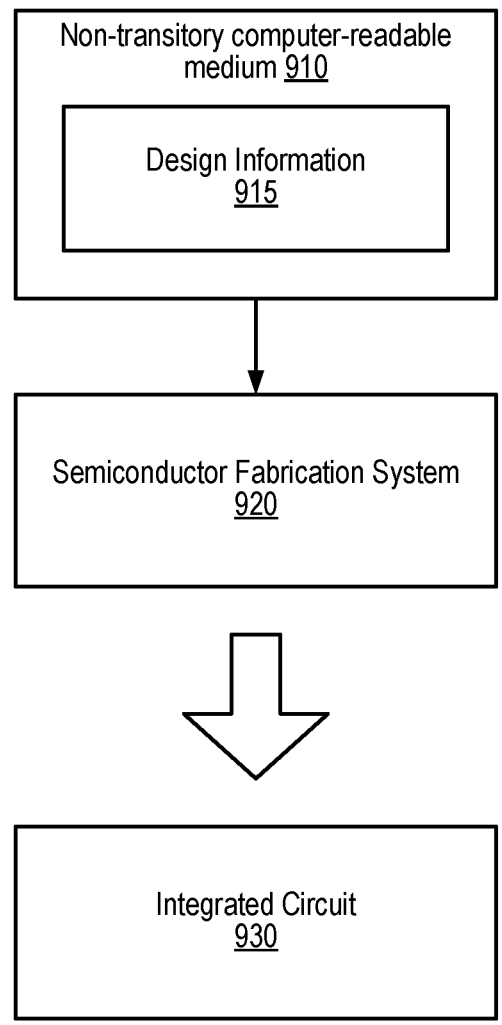
FIG. 9 illustrates a block diagram depicting an example computer-readable medium, according to some embodiments.

FIG. 9 is a block diagram illustrating an example of a non-transitory computer-readable storage medium that stores circuit design information, according to some embodiments. The embodiment of FIG. 9 may be utilized in a process to design and manufacture integrated circuits, such as, for example, integrated circuit 100 described herein. In the illustrated embodiment, semiconductor fabrication system 920 is configured to process the design information 915 stored on non-transitory computer-readable storage medium 910 and fabricate integrated circuit 930 based on the design information 915.

Non-transitory computer-readable storage medium 910, may comprise any of various appropriate types of memory devices or storage devices. Non-transitory computer-readable storage medium 910 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 910 may include other types of non-transitory memory as well or combinations thereof. Non-transitory computer-readable storage medium 910 may include two or more memory mediums which may reside in different locations, e.g., in different computer systems that are connected over a network.

Design information 915 may be specified using any of various appropriate computer languages, including hardware description languages such as, without limitation: VHDL, Verilog, SystemC, SystemVerilog, RHDL, M, MyHDL, etc. Design information 915 may be usable by semiconductor fabrication system 920 to fabricate at least a portion of integrated circuit 930. The format of design information 915 may be recognized by at least one semiconductor fabrication system, such as semiconductor fabrication system 920, for example. In some embodiments, design information 915 may include a netlist that specifies elements of a cell library, as well as their connectivity. One or more cell libraries used during logic synthesis of circuits included in integrated circuit 930 may also be included in design information 915. Such cell libraries may include information indicative of device or transistor level netlists, mask design data, characterization data, and the like, of cells included in the cell library.

Integrated circuit 930 may, in various embodiments, include one or more custom macrocells, such as memories, analog or mixed-signal circuits, and the like. In such cases, design information 915 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. As disclosed above, semiconductor fabrication system 920 may have limitations regarding a repeatability of fabricating devices, such as MOSFETs, even when two or more MOSFETs are implemented with the same parameters in design information 915. Such limitations may be constrained within a set of fabrication tolerances for semiconductor fabrication system 920, such that two MOSFETs implemented using the same design parameters have electrical characteristics that are within the fabrication tolerances. Semiconductor fabrication system 920 may also be configured to perform various testing of fabricated circuits for correct operation, including, for example, causing test circuits 110*a* and/or 110*b* to perform the operations disclosed herein.

In various embodiments, integrated circuit 930 is configured to operate according to a circuit design specified by design information 915, which may include performing any of the functionality described herein. For example, integrated circuit 930 may include any of various elements shown or described herein. Further, integrated circuit 930 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
an integrated circuit that includes:
an in-circuit power switch coupled to a power supply node;
a functional circuit coupled between the in-circuit power switch and a ground node;
a test circuit; and
a test power switch coupled to the test circuit, wherein the test power switch is a replica of the in-circuit power switch;
wherein the test circuit is configured to:
determine characteristics of the test power switch;
measure a voltage difference across the in-circuit power switch; and
use the characteristics of the test power switch and the voltage difference to determine a power consumption of the functional circuit.

2. The apparatus of claim 1, wherein to determine the characteristics of the test power switch, the test circuit is further configured to:
close the test power switch; and
measure a voltage difference across the test power switch while a particular amount of current passes through the test power switch.

3. The apparatus of claim 1, wherein to determine the power consumption of the functional circuit, the test circuit is further configured to estimate a current flowing the in-circuit power switch using a determined on-resistance of the test power switch and the voltage difference across the in-circuit power switch.

4. The apparatus of claim 1, wherein the integrated circuit further includes a plurality of test power switches, including the test power switch, and wherein ones of the plurality of test power switches have different characteristics from other test power switches.

5. The apparatus of claim 4, wherein to use the characteristics of the test power switch, the test circuit is further configured to select a corresponding test power switch from the plurality of test power switches using a lookup table that maps in-circuit power switches to corresponding ones of the plurality of test power switches.

6. The apparatus of claim 1, wherein the in-circuit power switch includes a particular number of switching elements, wherein one switching element corresponds to the test power switch, and wherein the test circuit is further configured to:
adjust the characteristics of the test power switch using the particular number; and
determine the power consumption of the functional circuit using the adjusted characteristics.

7. The apparatus of claim 1, wherein the test circuit includes an analog-to-digital converter (ADC) and wherein to measure the voltage difference across the in-circuit power switch, the test circuit is further configured to:
use the ADC to generate respective values indicative of voltage levels of an input terminal and an output terminal of the in-circuit power switch; and
use the generated values to determine the voltage difference.

8. A method, comprising:
measuring, by a test circuit, characteristics of a particular test power switch included in an integrated circuit, wherein the particular test power switch is a replica of an in-circuit power switch included in the integrated circuit;
measuring, by the test circuit, voltage levels of one or more terminals of the in-circuit power switch;
determining, by the test circuit, a current through the in-circuit power switch using the characteristics of the particular test power switch and the measured voltage levels; and
estimating, by the test circuit using the determined current, a power consumption of a functional circuit coupled to the in-circuit power switch.

9. The method of claim 8, wherein the characteristics of the particular test power switch include an on-resistance, and wherein determining the current through the in-circuit power switch includes estimating a value for the on-resistance for the in-circuit power switch using the on-resistance of the particular test power switch.

10. The method of claim 8, further comprising measuring, by the test circuit, respective characteristics of a plurality of test power switches, including the particular test power switch.

11. The method of claim 10, wherein determining the current through the in-circuit power switch includes selecting, by the test circuit, the respective characteristics of the particular test power switch based on a similarity of the particular test power switch to the in-circuit power switch.

12. The method of claim 8, wherein determining the characteristics of the particular test power switch includes:
closing the particular test power switch;
setting an adjustable impedance to cause a particular amount of current to flow through the closed test power switch; and
measuring a particular set of voltage levels of an input terminal and an output terminal of the closed test power switch while the particular amount of current flows through the closed test power switch.

13. The method of claim 12, further comprising:
causing a different amount of current to flow through the closed test power switch;
measuring a different set of voltage levels of the input terminal and the output terminal of the closed test power switch while the different amount of current flows through the closed test power switch; and
determining the characteristics of the particular test power switch using the particular set of voltage levels and the different set of voltage levels.

14. An apparatus, comprising:
an integrated circuit that includes:
an in-circuit power switch coupled to a power supply node;
a functional circuit coupled between the in-circuit power switch and a ground node;
a particular test power switch that is a replica of the in-circuit power switch; and
a test circuit configured to:
determine a set of leakage current measurements for the particular test power switch using a corresponding set of voltage levels applied across the particular test power switch;
measure a voltage difference across the in-circuit power switch;
using the measured voltage difference, select a particular leakage current measurement of the set; and
determine a leakage current through the in-circuit power switch using the particular leakage current measurement.

15. The apparatus of claim 14, further including a plurality of test power switches, wherein respective characteristics differ among the plurality of test power switches, and wherein the test circuit is further configured, for two or more of the plurality of test power switches, to:
apply a set of voltage levels across each of the two or more of the plurality of test power switches, including the particular test power switch; and
determine respective sets of leakage current measurements for each of the two or more of the plurality of test power switches.

16. The apparatus of claim 15, wherein the test circuit is further configured to select a particular set of leakage current measurements from the respective sets, based on a similarity of the particular test power switch to the in-circuit power switch.

17. The apparatus of claim 14, wherein the test circuit is further configured to apply the corresponding set of voltage levels using a programmable impedance coupled to the particular test power switch.

18. The apparatus of claim 14, wherein the in-circuit power switch includes a particular number of switching elements, wherein one switching element corresponds to the particular test power switch, and wherein to determine the leakage current through the in-circuit power switch, the test circuit is further configured to multiply the particular leakage current measurement by the particular number.

19. The apparatus of claim 14, wherein the test circuit includes an analog-to-digital converter (ADC) configured to:
sample the voltage difference across the in-circuit power switch;
generate a value indicative of the voltage difference; and
provide the generated value to the test circuit.

20. The apparatus of claim 14, wherein to select the particular leakage current measurement of the set using the measured voltage difference, the test circuit is configured to select a leakage current measurement that was measured with a closest applied voltage level to the measured voltage difference.

* * * * *